(12) United States Patent
Grimsley (10) Patent No.: US 6,956,194 B2
(45) Date of Patent: Oct. 18, 2005

(54) SYSTEMS AND METHODS FOR FABRICATING AN ELECTRO-OPTICAL DEVICE USED FOR IMAGE SENSING

(75) Inventor: Thomas J. Grimsley, Fairport, NY (US)

(73) Assignee: Xerox Corporation, Stamford, CT (US)

(*) Notice: Subject to any disclaimer, the term of this patent is extended or adjusted under 35 U.S.C. 154(b) by 669 days.

(21) Appl. No.: 09/750,425

(22) Filed: Dec. 28, 2000

(65) Prior Publication Data

US 2002/0086457 A1 Jul. 4, 2002

(51) Int. Cl.[7] .............................................. H01L 27/00
(52) U.S. Cl. .................................................... 250/208.1
(58) Field of Search .............................. 250/208.1, 226, 250/208.2, 235, 216; 356/416; 257/291, 667, 233, 440, 432, 433; 438/68–81, 460–462, 795

(56) References Cited

U.S. PATENT DOCUMENTS

| 5,904,362 A | 5/1999 | Yoo ............................ 280/237 |
| 6,171,885 B1 * | 1/2001 | Fan et al. ...................... 438/70 |
| 6,198,093 B1 * | 3/2001 | Ormond et al. ............. 250/226 |

OTHER PUBLICATIONS

Peurrung, Loni M. et al., "Spin Coating Over Topography." *IEEE Transactions on Semiconductor Manufacturing,* vol. 6, No. 1, Feb. 1993, pp.: 73–76.

* cited by examiner

*Primary Examiner*—Tu T. Nguyen
(74) *Attorney, Agent, or Firm*—Fay, Sharpe, Fagan, Minnich & McKee, LLP (57) ABSTRACT

Methods and systems for making an electro-optical device suitable for use in an image forming system are described. The device includes photosensors, which are covered by filter layers, to sense the presence of color in a document. The methods and systems provide for leaving a first filter layer on a non-sensor area to prepare the device for a substantially uniform application of a second filter layer.

16 Claims, 9 Drawing Sheets

SYSTEMS AND METHODS FOR FABRICATING AN ELECTRO-OPTICAL DEVICE USED FOR IMAGE SENSING

TECHNICAL FIELD

The present invention relates generally to an electro-optical device, and specifically relates to the fabrication of an electro-optical device employed in an image forming system.

BACKGROUND OF THE INVENTION

As copying and scanning of color documents becomes more prevalent, there has arisen a need for a solid-state electro-optical device suitable for sensing images, such as a silicon chip having an array of photosensors. For a photosensor to be sensitive to a specific primary color, a translucent filter layer, such as a polyimide layer that has been dyed or pigmented to the specific primary color, may be applied on the surface of the chip. If a single photosensitive chip is intended to have multiple linear arrays of photosensors, each linear array being sensitive to one particular primary color, particular polyimide filter layers are applied to specific linear arrays, thereby creating a full-color photosensitive chip.

Figure 1:
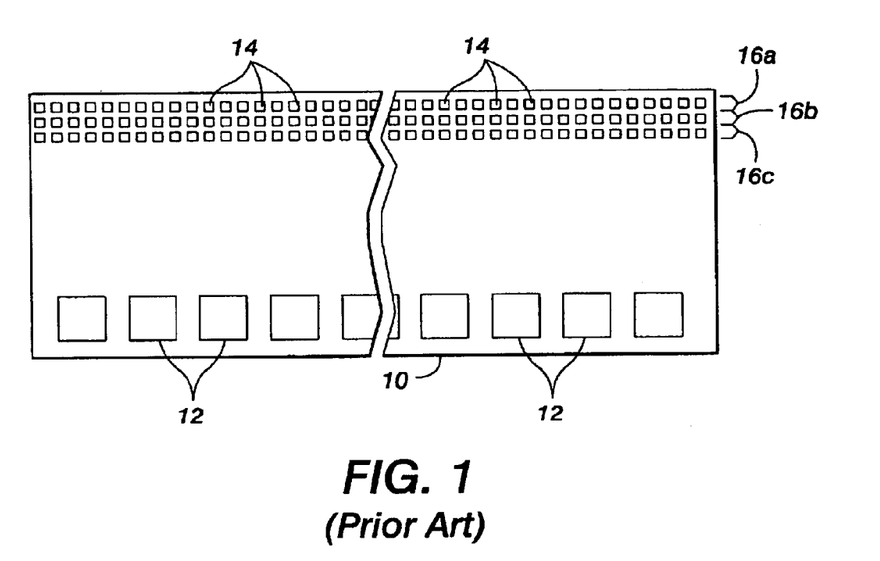
FIG. 1 is a plan view of a conventional photosensitive chip.

FIG. 1 is a plan view of two photosensitive chips 10 fashioned from a single wafer 11. The chips 10 are of a general design found, for example, in a full-color photosensor scanner of the prior art. The chip 10 includes a number of bonding pads 12, and one or more linear arrays of photosensors 14. A typical design of a full-page-width scanner will include a plurality of chips 10, each chip being approximately one-half to one inch in length, the chips 10 being butted end-to-end to form a collinear array of photosensors 14, which extends across a page image being scanned.

Each chip 10 is a silicon-based integrated circuit chip having on a surface three independently functioning linear arrays of photosensors 14. The photosensors 14 are disposed in three parallel rows that extend across a main dimension of the chip 10, these individual rows being shown as 16a, 16b, and 16c. Each individual row of photosensors on the chip 10 can be made sensitive to a particular color by applying to the particular rows 16a, 16b, and 16c a spectrally translucent filter layer that covers only the photosensors in a particular row. For example, the three rows of photosensors can be filtered with a different primary color, such as red, green, and blue. Generally, each individual photosensor 14 is adapted to output a charge or voltage signal indicative of the intensity of light of a certain type impinging thereon. Various structures, such as transfer circuits, or charge-coupled devices, are known in the art for processing signal output by the various photosensors 14.

One method of constructing a full-color photosensitive chip 10 according to the prior art is to first construct a wafer 11 having a relatively large number, such as one hundred or more, semiconductor structures, each structure corresponding to one chip 10. Two such chips are shown in FIG. 1. For full-color chips, the wafer 11 is coated with multiple layers of translucent filter material by spin coating. A filter liquid, corresponding to a filter of a particular color, is poured near the center of the wafer 11, and then the wafer 11 is spun about an axis 17 to spread the liquid. The filter material may then be etched away as needed, to yield the three primary-color-filtered linear arrays of photosensors 14, as known to those of ordinary skill in the art. Only after the filter layers are applied as desired is the wafer "diced," or sawed into individual chips.

In the foregoing method of fabricating a full-color photosensitive chip 10, a problem may arise when applying successive translucent filter layers. In particular, the process of applying a filter coat to the chip may cause the coat to be thicker on some photosensors than on others. Different thicknesses of the filter coat result in different intensities of light passing through the filter material to a particular photosensor. Such variations may result in diminished reproduction quality. For photosensors of a particular type on a single chip, it is desirable that the filter coat be of uniform thickness. In addition, when applying a filter coat, it is desirable to leave a smooth surface on the chip on which to apply the next filter coat. If the surface is not smooth, color reproduction quality can suffer.

SUMMARY OF THE INVENTION

For the foregoing reasons, there exists in the art a need for systems and methods for fabricating an electro-optical device for sensing images in an image forming system. Accordingly, described herein is a method of fabricating an electro-optical device suitable for use in an image forming system, the method including the steps of imbedding a sensor in a substrate to form a sensor area and a non-sensor area, and applying a first filter layer on at least a portion of the non-sensor area to at least partially planarize the device. The method further includes the step of applying a second filter layer over at least a portion of the substrate without removing the first filter layer on the non-sensor area. At least one of the first and second filter layers may contain a pigment. The method may further include the step of applying a base layer, which may be translucent, on the substrate before the step of applying a first filter layer. The method may also include the step of mounting the electro-optical device in an image forming system.

The method may further include the steps of applying a second filter layer on at least a portion of a second non-sensor area to at least partially planarize the device, and applying a third filter layer over at least a portion of the substrate without removing the second filter layer on the second non-sensor area. The first, second, and third filter layers may correspond to primary colors.

Also described herein is a method of making a photosensitive chip for image sensing, the method including the steps of imbedding a photosensor in a substrate of a photosensitive chip, covering a sensor area with a filter layer, the sensor area substantially overlying the photosensor. The method further includes permanently covering a non-sensor area with the filter layer to at least partially planarize a surface of the photosensitive chip, the non-sensor area not substantially overlying the photosensor, and applying a second filter layer over at least a portion of the substrate.

A method of applying a filter layer of substantially uniform thickness for an image forming system is also described herein, the method including the steps of providing a wafer containing at least two photosensors, and applying a first filter layer on at least a portion of a non-sensor area of the wafer for applying a second filter layer of substantial uniform thickness over the at least two photosensors.

In addition, an electro-optical device suitable for use in an image forming system is provided herein. The device includes a substrate, a sensor embedded in the substrate forming a sensor area and a non-sensor area, a first filter layer on at least a portion of the non-sensor area to at least partially planarize the device, and a second filter layer applied over at least a portion of the substrate without removing the first filter layer on the at least a portion of the non-sensor area.

BRIEF DESCRIPTION OF THE DRAWINGS

The aforementioned features and advantages, and other features and aspects of the present invention, will become better understood with regard to the following description and accompanying drawings.

DETAILED DESCRIPTION OF THE INVENTION

Figure 2A:
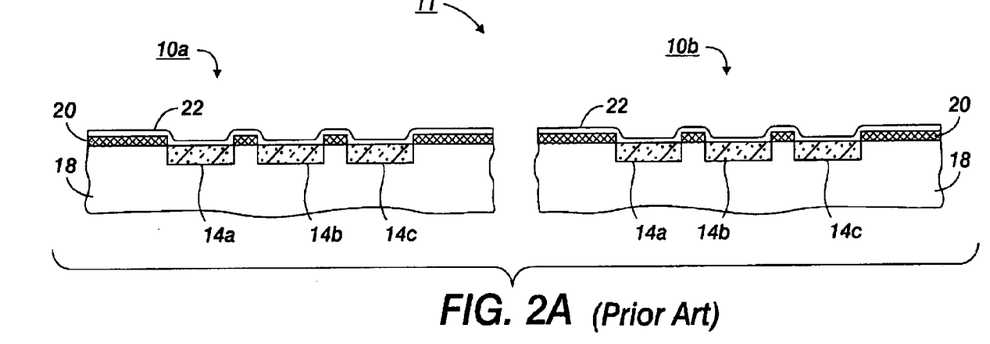
FIGS. 2A–E illustrate in cross-section electro-optical devices employed in an image forming system and fabricated according to conventional methods.

Referring to FIGS. 2A–2E, a series of cross-sectional views of an electro-optical device is depicted illustrating the maimer in which a photosensitive chip can be manufactured according to conventional methods. Parts of two photosensitive chips 10a and 10b are shown in cross-section fashioned from the single wafer 11. In FIG. 2A, three photosensors 14a–c are shown embedded in a substrate 18 in part of the photosensitive chips 10a and 10b. Some surface irregularities are also shown as the surface topography 20. A clear base layer 22 may be disposed on the top surface of the substrate 18.

Figure 2B:
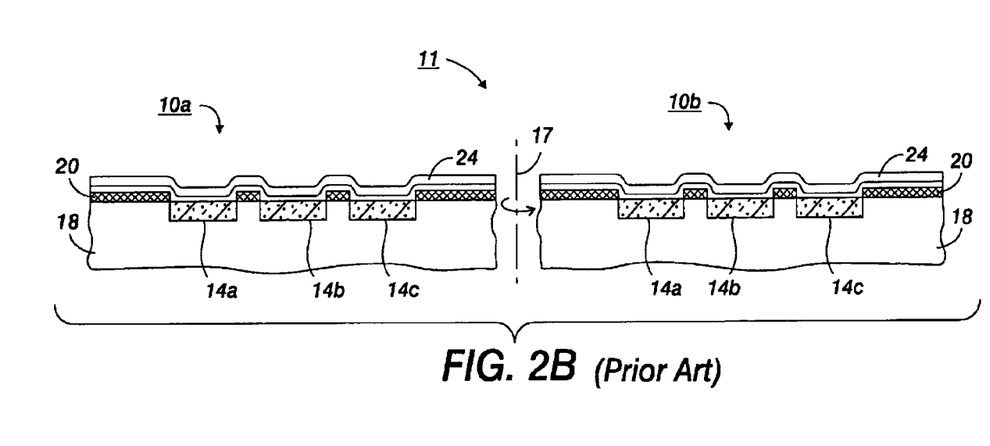
Figure 2C:
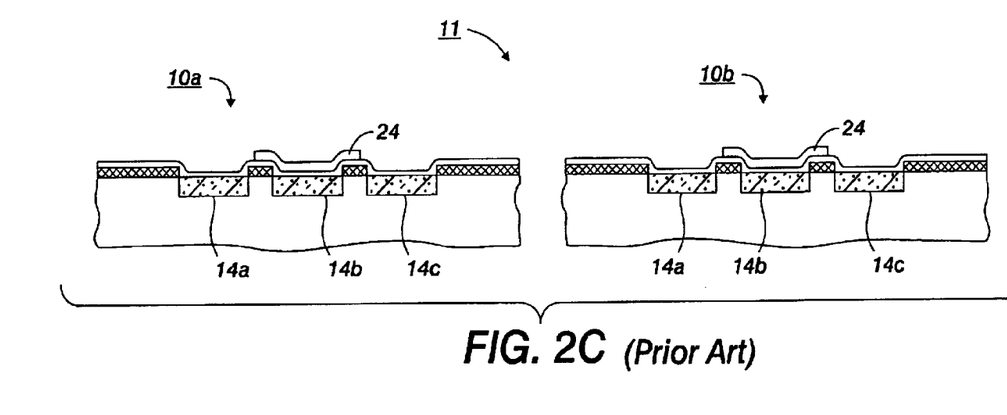

Referring now to FIG. 2B, a first filter layer 24 is disposed on top of the clear base layer 22. The filter layer 24 may contain, for example, acrylic or polyimide and, in addition to filtering light, may act as a photoresist. The filter layer 24 may be applied using the method of spin coating, where a filter liquid is applied near the center of the wafer 11, and the wafer is then spun about an axis 17 to spread the filter liquid, and thereby form a first filter layer 24. Referring to FIG. 2C, the first filter layer 24 is then patterned by removing the layer 24 from selected regions. In particular, the first filter layer 24 is allowed to remain only in an area substantially on top of the second photosensor 14b.

Figure 2D:
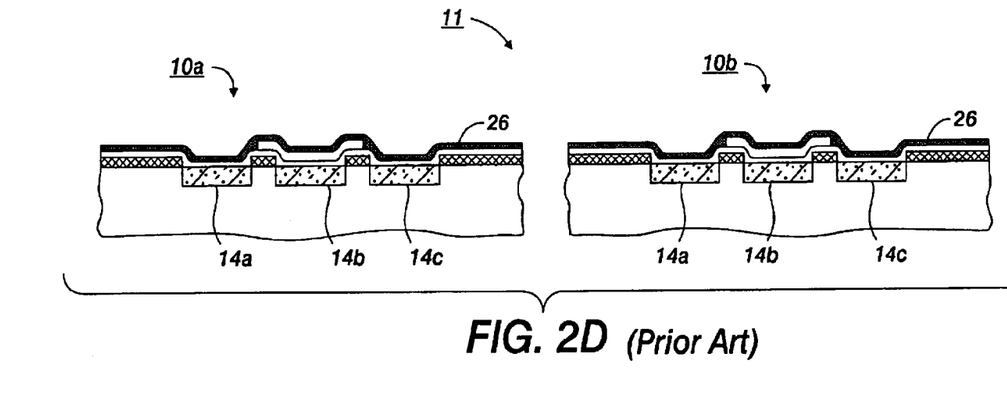
Figure 2E:
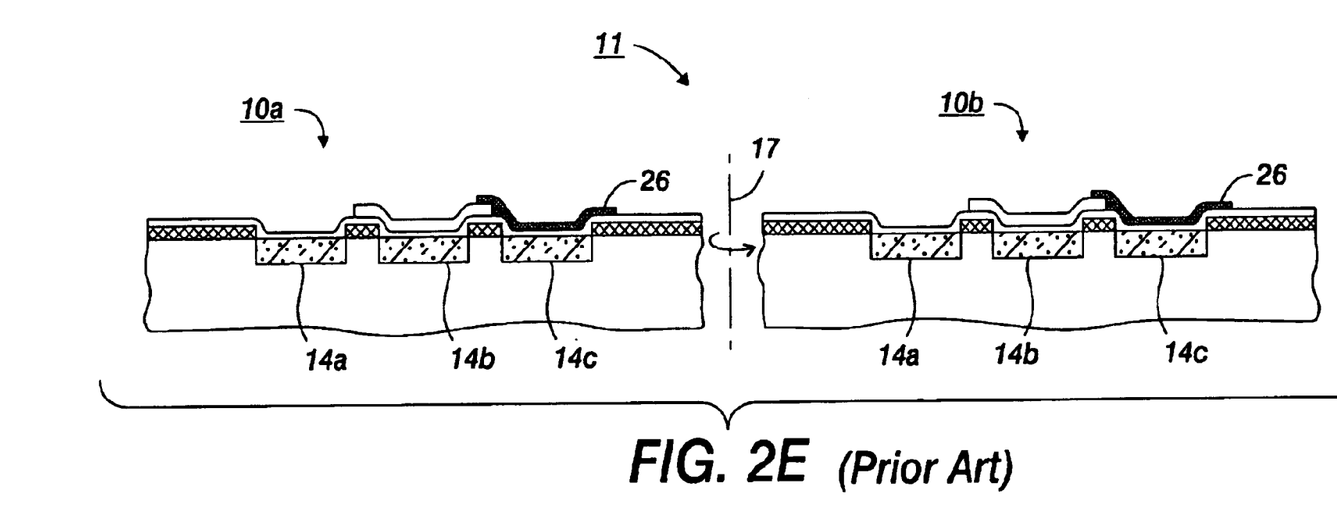

Referring to FIG. 2D, a second filter layer 26 is disposed over the substrate 18. The layer 26 may be applied by spin coating. Referring to FIG. 2E, the second filter layer 26 is then patterned by removing the layer 26 from selected regions. In particular, the second filter layer 26 is allowed to remain only in an area substantially on top of the third photosensor 14c.

In the foregoing method of fabricating a full-color photosensitive chip 10, a problem arises when applying successive translucent filter layers. In particular, the process of applying a filter coat to the chip causes the coat to be thicker on some photosensors than on others. For example, in the spin coating technique described above, a liquid filter material is poured near the axis 17, and the wafer 11 is then spun to spread the liquid on the surface of the substrate 18, and thus form the second filter layer 26. However, this method results in a thinner application of the filter layer 26 over the outermost photosensors (i.e., photosensor 14a in chip 10a, and photosensor 14c in chip 10b) because the first filter layer 24 acts as a kind of dam that causes a backup of liquid before the dam, and a dearth of liquid after the dam. The result is that the second filter layer 26 is thicker over the photosensor 14c of chip 10a, than over the photosensor 14c of chip 10b.

Sensors placed next to each other in the linear imaging array are formed from different parts of the wafer 11. Therefore, any two photosensors in the array sensing the same color of light may have above them filter layers of different thicknesses, resulting in different intensities of light passing through the disparate filter layers to the photosensors below. Such variations result in diminished image reproduction quality.

Referring to FIGS. 3A–3D, a series of diagrams is depicted illustrating the manner in which an electro-optical device, such as a photosensitive chip 10, for sensing images in an image forming system, can be manufactured according to the teachings of the present invention. Image forming systems include electrophotographic, electrostatic or electrostatographic, ionographic, and other types of image forming or reproducing systems that are adapted to capture and/or store image data associated with a particular object, such as a document. The system of the present invention is intended to be implemented in a variety of environments, such as in any of the foregoing types of image forming systems, and is not limited to the specific systems described below.

Figure 3A:
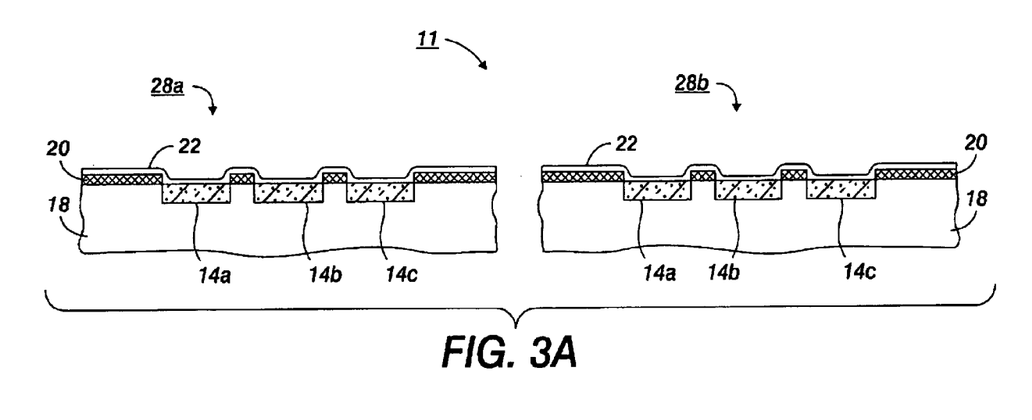
FIGS. 3A–D illustrate in cross-section electro-optical devices fabricated according to the teachings of the present invention.

Referring to FIG. 3A, two electro-optical devices 28a and 28b are shown in cross-section fashioned from the single wafer 11. Three photosensors 14a–c are embedded in a substrate 18 in each of the electro-optical devices 28a and 28b. Some surface irregularities are also shown as the surface topography 20. The surface topography 20 may arise, for example, from circuit elements, such as electrical leads, placed on the electro-optical devices 28a and 28b. A translucent base layer 22 may be disposed on the top surface of the substrate 18.

The photosensors 14a–c include a device adapted to output a signal indicative of the frequency or intensity of light impinging thereon. Various photosensors, such as charge coupled devices, and complimentary metal oxide semiconductor sensors, are known in the art that can be used in the photosensitive chip 10.

The translucent base layer 22 can be used for smoothing the surface irregularities that form the surface topography 20. In other embodiments, the application of this translucent base layer 22 may be omitted. As used herein, the term "smoothing" is intended to include reducing, eliminating, or preventing the formulation of relatively sharp profiles of irregularities or other formed topographical structures present in one or more layers of the electro-optical device to promote or enhance the transfer or flow of a liquid material, such as the filter material, across the surface of the electro-optical device without creating significant layer thickness irregularities as measured across the surface of the device.

Figure 3B:
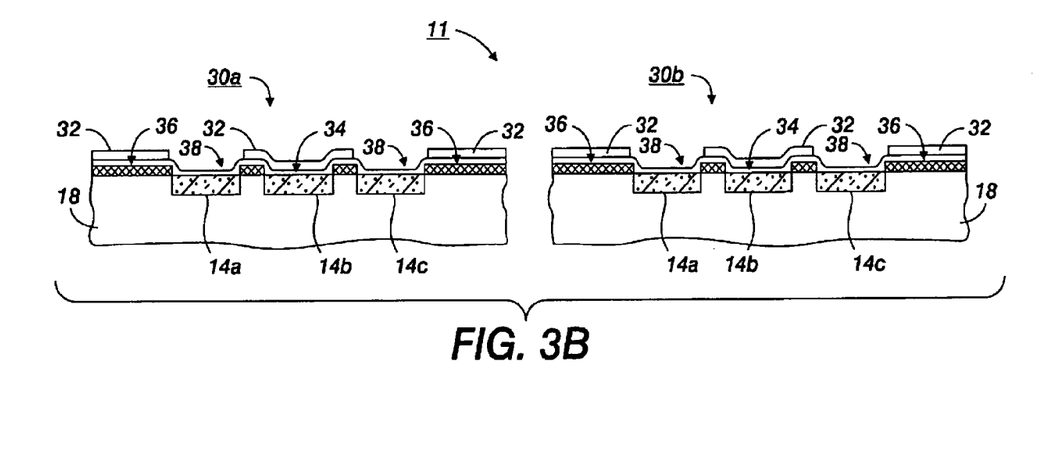

Referring now to FIG. 3B, two electro-optical devices 30a and 30b are shown in cross-section fashioned from the single wafer 11. A first filter layer 32 is disposed on top of a portion of the translucent base layer 22. In particular, the first filter layer 32 covers a sensor area 34. The term sensor area refers to an area of an electro-optical device, such as device 30a or 30b, substantially overlying a photosensor, such as photosensor 14b. In addition, the first filter layer 32 covers a non-sensor area 36. The term non-sensor area refers to an area of an electro-optical device, such as device 30a or 30b, not substantially overlying a photosensor. The layer 32 is left on the non-sensor area 36 as a second filter layer 42 (FIG. 3C) is applied, as described below. In one embodiment, the first filter layer 32 lying above the non-sensor area 36 may be removed after the second filter layer 32 has been applied. In another embodiment, the first filter layer 32 is left permanently on the non-sensor area 36, and not removed even after the application of subsequent filter layers.

The first filter layer 32 may be applied using the method of spin coating, where a filter liquid is applied near the center of the wafer 11, and the wafer then spun about an axis 17 to spread the filter liquid, and thereby form a first filter layer 32. The first filter layer 32 is then patterned by removing, or etching away the layer 32 from selected regions. In particular, the first filter layer 32 is removed from the sensor areas 38, areas above the first photosensor 14a and third photosensor 14c. The result is the electro-optical device 30a or 30b.

Covering the sensor area 34 that overlies the second photosensor 14b with a first filter layer 32 preferentially allows light having a wavelength within a first range to reach the photosensor 14b. For example, the first filter layer 32 may be pigmented or dyed so that the only light that reaches the photosensor 14b is light having a wavelength within a small range of frequencies near the frequency of a first primary color, such as red, green, or blue. In this manner, the photosensor 14b can be made sensitive to a first range of frequencies to help in producing color images in image forming systems.

Leaving the first filter layer 32 on the non-sensor area 36 as a second filter layer 42 (FIG. 3C) is applied, as described below, functions to at least partially planarize the electro-optical devices 30a and 30b. In addition to partially planarizing the surface, leaving the first filter layer over non-sensing areas provides for a more structurally uniform surface that is presented to the second filter layer. The second filter can flow in the same fashion across the entire wafer. Even though the surface is not completely smooth, the differences between chips are reduced as the second filter behaves in a similar fashion on every chip. Partially planarizing the devices 30a and 30b in this manner improves the uniformity of the second filter layer 42 in a subsequent application.

The term planarize denotes adding layers in such a fashion that surface topography is evened out so that the surface approaches a flat, planar surface. The degree of planarization is indicative of how much the surface has been smoothed after the treatment. For example, if there are 2 micron step heights before treatment and treatment A leaves step heights of 1 micron and treatment B leaves step heights of 0.2 microns, it can be said that treatment A has partially planarized the surface and treatment B has almost completely planarized the surface. The amount of surface topography left after the treatment describes the degree of planarization. A conformal layer coats the surface and follows the contours. It does not reduce the topography by much and can be said to have a low degree of planarization. Leaving the filter behind over the non sensor areas does partially planarize the surface, in addition to leaving behind a more periodic, uniform topography.

The wafer 11 may eventually be cut up to produce individual chips 10, which may then be butted together to form a linear array as in FIG. 1. It is advantageous when photosensors on different chips sensitive to the same color have a filter layer thereon of uniform thickness. When the filter layers over such photosensors have a substantially uniform thickness, a condition that obtains when the principles of the present invention are utilized, the production quality of color documents is increased.

Figure 3C:
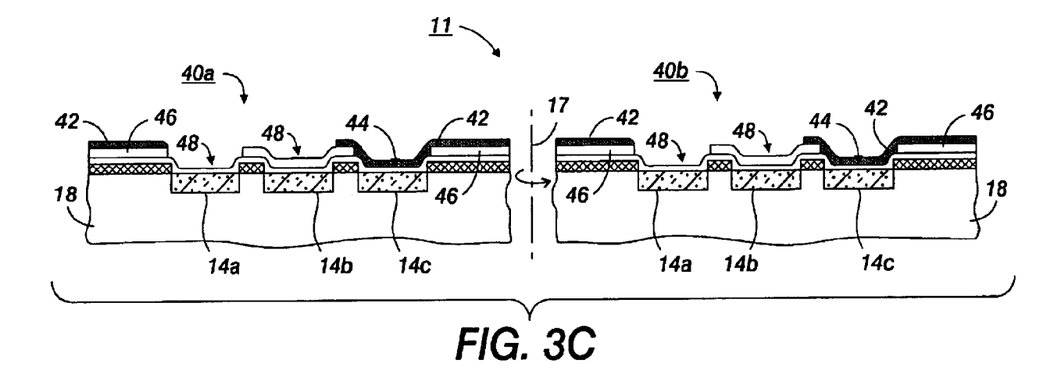

Referring now to FIG. 3C, two electro-optical devices 40a and 40b are shown in cross-section fashioned from the single wafer 11. The second filter layer 42 covers a sensor area 44. The term sensor area refers to an area of an electro-optical device, such as device 40a or 40b, substantially overlying a photosensor, such as photosensor 14c. In addition, the second filter layer 42 covers a non-sensor area 46. The term non-sensor area refers to an area of an electro-optical device, such as device 40a or 40b, not substantially overlying a photosensor. The layer 42 is left on the non-sensor area 46 as a third filter layer 52 (FIG. 3D) is applied, as described below. In one embodiment, the second filter layer 42 lying above the non-sensor area 46 may be removed after the third filter layer 52 has been applied. In another embodiment, the third filter layer 52 is left permanently on the non-sensor area 46, and not removed even after the application of subsequent filter layers.

The second filter layer 42 may be applied using the method of spin coating, where a filter liquid is applied near the center of the wafer 11, and the wafer then spun about an axis 17 to spread the filter liquid, and thereby form a second filter layer 42. The second filter layer 42 is then patterned by removing, or etching away the layer 42 from selected regions. In particular, the second filter layer 42 is removed from the sensor areas 48, areas above the first photosensor 14a and second photosensor 14b. The result is the electro-optical device 40a or 40b.

Covering the sensor area 44 that overlies the third photosensor 14c with a second filter layer 42 preferentially allows light having a wavelength within a second range to reach the photosensor 14c. For example, the second filter layer 42 may be pigmented or dyed so that the only light that reaches the photosensor 14c is light having a wavelength within a small range of frequencies near the frequency of a second primary color, such as red, green, or blue. In this manner, the photosensor 14c can be made sensitive to a second range of frequencies to help in producing color images in image forming systems.

Leaving the second filter layer 42 on the non-sensor area 46 as a third filter layer 52 (FIG. 3D) is applied, as described below, functions to at least partially planarize the electro-optical devices 40a and 40b. Partially planarizing the devices 40a and 40b in this manner improves the uniformity of the third filter layer 52 in a subsequent application.

Figure 3D:
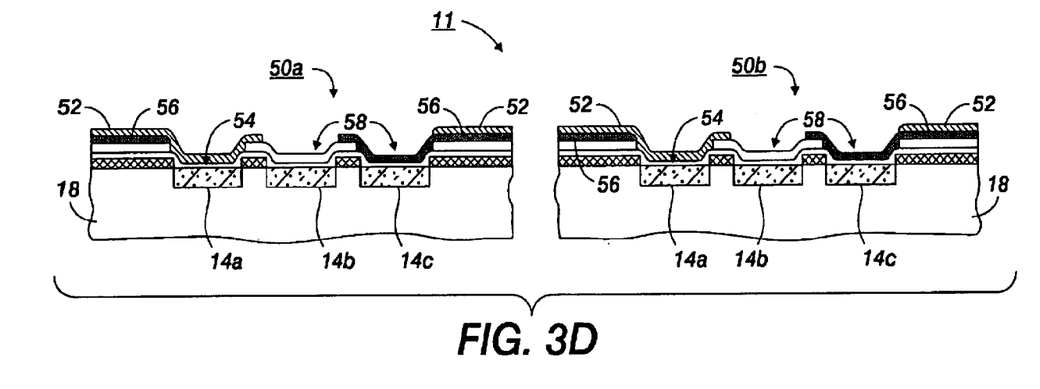

Referring now to FIG. 3D, two electro-optical devices 50a and 50b are shown in cross-section fashioned from the single wafer 11. The third filter layer 52 covers a sensor area 54. In addition, the third filter layer 52 covers a non-sensor area 56. In one embodiment, the third filter layer 52 lying above the non-sensor area 56 may be removed, or left behind permanently.

The third filter layer 52 may be applied using the method of spin coating, where a filter liquid is applied near the center of the wafer 11, and the wafer then spun about an axis 17 to spread the filter liquid, and thereby form a third filter layer 52. The third filter layer 52 is then patterned by removing, or etching away the layer 52 from selected regions. In particular, the third filter layer 52 is removed from the sensor areas 58, areas above the second photosensor 14b and third photosensor 14c. The result is the electro-optical device 50a or 50b.

Covering the sensor area 54 that overlies the first photosensor 14a with a third filter layer 52 preferentially allows light having a wavelength within a third range to reach the photosensor 14a. For example, the third filter layer 52 may be pigmented or dyed so that the only light that reaches the photosensor 14a is light having a wavelength within a small range of frequencies near the frequency of a third primary color, such as red, green, or blue. In this manner, the photosensor 14a can be made sensitive to a third range of frequencies to help in producing color images in image forming systems.

Those of ordinary skill will readily recognize that any number of additional layers can be formed on the substrate. Leaving filter layers on non-sensor areas as described above will likewise improve the uniformity of these layers.

The principles of the present invention can also be applied to other primary colors, such as cyan, magenta, and yellow (CMY). Referring to FIG. 4A–D, a series of diagrams is depicted illustrating the manner in which an electro-optical device, such as a photosensitive chip 10, for sensing images in an image forming system, can be manufactured according to the present invention using the three primary colors CMY.

Figure 4A:
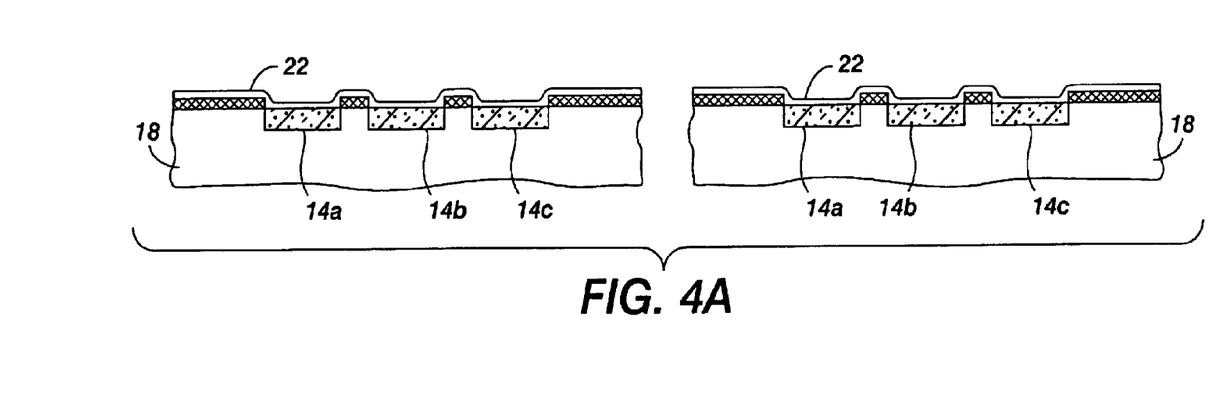
FIGS. 4A–D illustrate in cross-section electro-optical devices fabricated according to the teachings of the present invention.
Figure 4B:
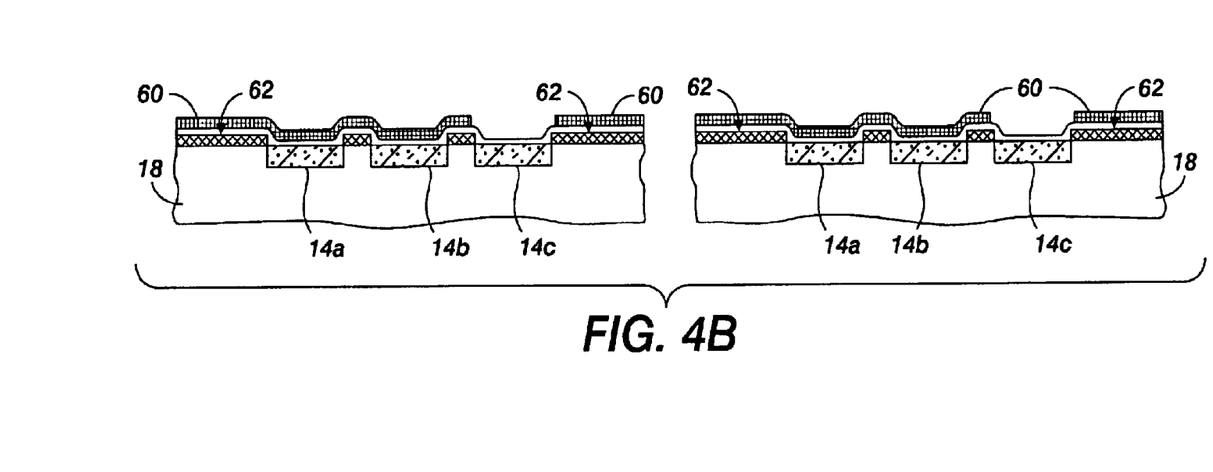
Figure 4C:
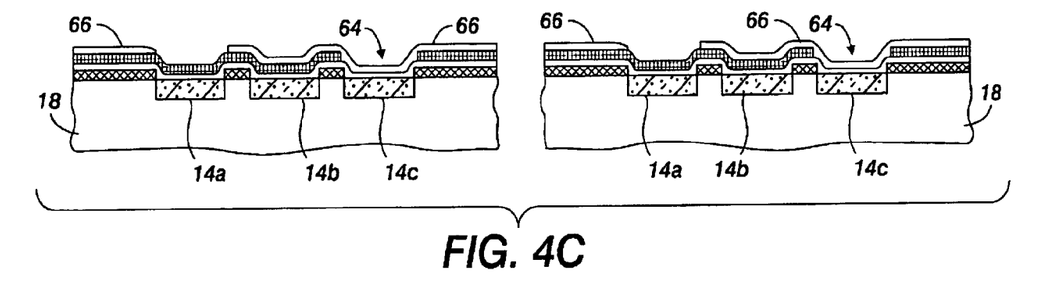
Figure 4D:
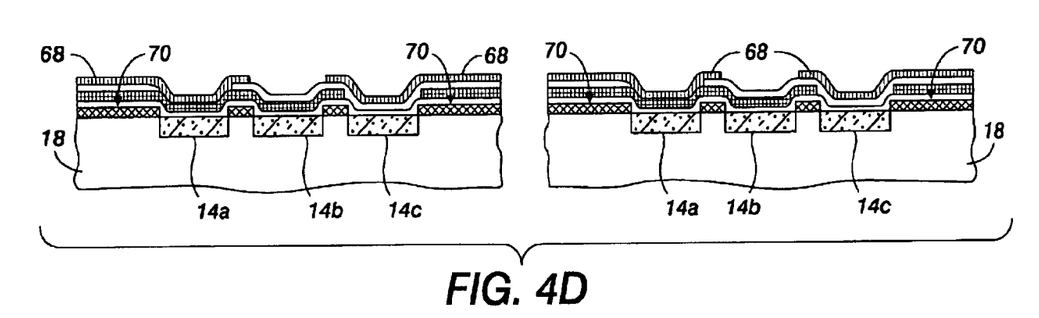

Referring to FIG. 4A, a base layer 22 is disposed on a substrate 18 as in FIG. 3A. In FIG. 4B, a cyan filter layer 60 overlies the photosensors 14a and 14b. The cyan filter layer 60 is etched away from above the third photosensor 14c. The cyan filter layer is placed over the non-sensor areas 62 to at least partially planarize the electro-optical device, thereby allowing a more uniform application of subsequent layers. Referring to FIG. 4C, a yellow filter layer 64 is placed over the photosensors 14b and 14c. Likewise, the yellow filter layer 64 is placed over the non-sensor areas 66 to at least partially planarize the electro-optical device. Referring to FIG. 4D, a magenta filter layer 68 is placed over the photosensors 14a, and 14c. Likewise, the magenta filter layer 68 is placed over the non-sensor areas 70. The cyan and yellow, magenta and yellow, and magenta and cyan filter layer combinations produce sensitivity to green, red, and blue colors, respectively. The electro-optical device thus obtained can be used in an image forming system according to the present invention.

Figure 5:
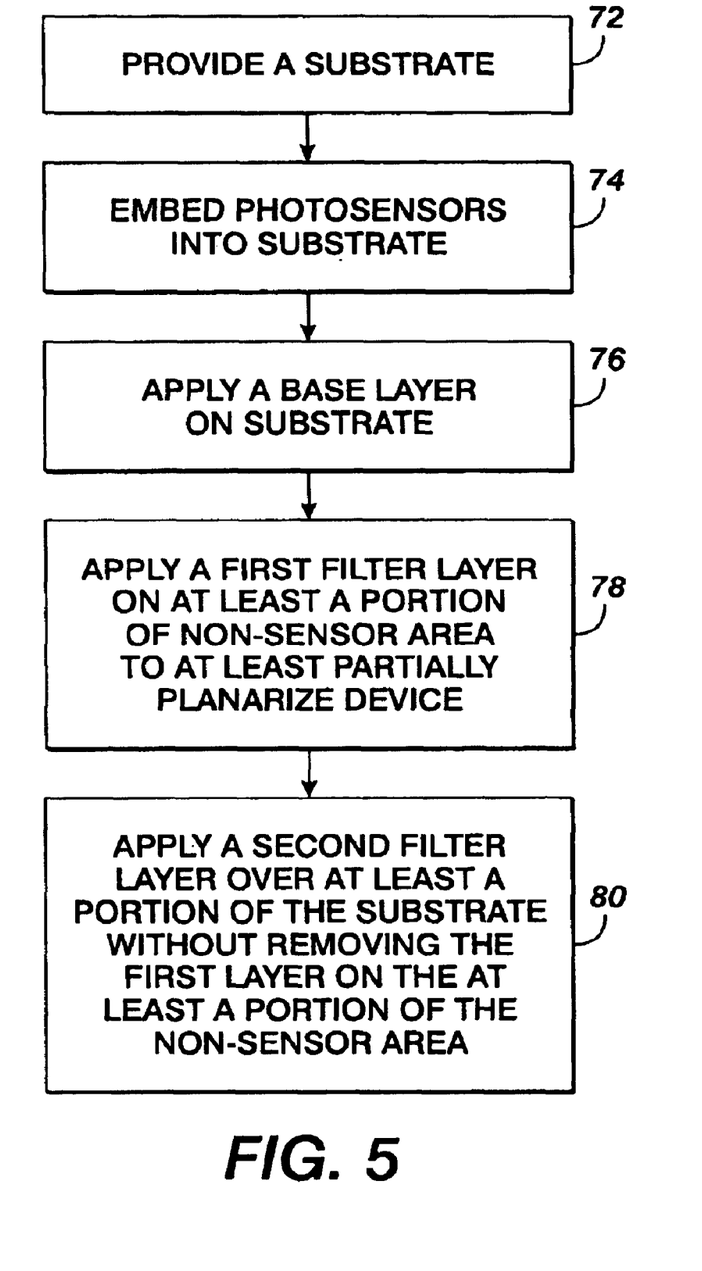
FIG. 5 shows a schematic flow chart diagram illustrating the steps for fabricating an electro-optical device for sensing images according to the teachings of the present invention.

Referring to FIG. 5, a flow chart is shown illustrating the steps of fabricating an electro-optical device for image sensing according to the teachings of the present invention. In step 72, a substrate 18 of the electro-optical device is provided, which functions as a foundation on which additional layers are applied. The substrate 18 may be part of a wafer 11 on which several photosensitive chips 10 are manufactured. In step 74, any suitable number of photosensors, such as first, second, and third photosensors 14a–c, are imbedded in the substrate 18, which results in the formation of sensor areas and non-sensor areas. The wafer 11 may be diced up into chips 10 containing such triples of photosensors 14. In optional step 76, a base layer 22 is applied on the substrate 20 by, for example, adding a liquid base layer material and spinning the wafer 11 to spread the material on the surface thereof. In step 78, a first filter layer 32 is applied on at least a portion of the non-sensor area to at least partially planarize the device. Subsequently, in step 80 a second filter layer 42 is applied over at least a portion of the substrate 18 without removing the first filter layer 32 on the at least a portion of the non-sensor area.

While the present invention has been described with reference to illustrative embodiments thereof, those skilled in the art will appreciate that various changes in form and detail may be made without departing from the intended scope of the present invention as defined in the appended claims.

What is claimed is:

1. A method of fabricating an electro-optical device suitable for use in an image forming system, the method comprising the steps of:
    embedding sensors in a substrate to form sensor areas, each sensor area substantially overlying an associated sensor, and a non-sensor area;
    depositing a base layer over each sensor area and the non-sensor area;
    applying a first filter layer on at least a portion of the substrate inclusive of the non-sensor area to at least partially planarize the device; and
    applying a second filter layer over at least a portion of the substrate without removing the first filter layer from the non-sensor area.

2. The method of claim 1, wherein, in the step of applying the base layer, the base layer is translucent.

3. The method of claim 1, further comprising the step of mounting the electro-optical device in the image forming system.

4. The method of claim 1, wherein, in the steps of applying the filter layers, at least one of the first and second filter layers contains a pigment.

5. The method of claim 1, further comprising the step of applying the second filter layer on at least a portion of the non-sensor area to at least partially planarize the device.

6. The method of claim 5, further comprising the step of applying a third filter layer over at least a portion of the substrate without removing the second filter layer from the non-sensor area.

7. The method of claim 6, wherein, in the steps of applying the filter layers, the first filter layer corresponds to a first primary color, the second filter layer corresponds to a second primary color, and the third filter layer corresponds to a third primary color.

8. A method of applying a filter layer of substantially uniform thickness for an image forming system, the method comprising the steps of:
    providing a substrate containing at least a first photosensor and a second photosensor, the first photosensor positioned closer to a point of an initial filter application than the second photosensor, the photosensors defining associated overlying sensor areas and non sensor areas; and
    applying a first filter layer on the substrate inclusive of a portion of the non-sensor area of the substrate to create a uniform surface to deposit a second filter layer of substantially uniform thickness over the photosensors, the non-sensor area being an area complimentary to each sensor area overlying each photosensor.

9. The method of claim 8, further comprising the step of applying a base layer on the substrate before the step of applying the first filter layer.

10. An electro-optical device suitable for use in an image forming system, the device comprising:
    a substrate;
    a first sensor embedded in the substrate forming a first sensor area overlying the first sensor and a first non-sensor area near the first sensor area;
    a second sensor embedded in the substrate forming a second sensor area overlying the second sensor;
    a third sensor embedded in the substrate forming a third sensor area overlying the third sensor and a second non-sensor area near the third sensor area;
    a first filter layer on the second sensor area and at least a portion of the first and second non-sensor areas to at least partially planarize the device;

a second filter layer on the third sensor area, the second filter being applied over at least a portion of the substrate including the first and second non-sensor areas to at least partially planarize the device without removing the first filter layer from the non-sensor areas; and a third filter layer on the first sensor area, the third layer being applied over at least a portion of the substrate without removing at least one of the first and second filter layers from the non-sensor areas.

11. The electro-optical device of claim 10, further comprising a base layer on the substrate.

12. A method of fabricating a color sensing semiconductor device comprising:

embedding at least a first sensor, a second sensor and a third sensor in a substrate;

the first sensor defining an associated first sensor area, overlying the first sensor, and a first non-sensor area, disposed near the first sensor area;

the second sensor defining an associated second sensor area, overlying the second sensor;

the third sensor defining an associated third sensor area, overlying the third sensor, and a second non-sensor area, disposed near the third sensor area;

depositing a first filter layer over the substrate, exclusive of the third sensor area;

depositing a second filter layer over the substrate, exclusive of the first sensor area; and depositing a third filter layer over the substrate, exclusive of the second sensor area.

13. The method as set forth in claim 12, further including:

applying a clear base layer before depositing the first filter layer over the substrate.

14. The method as set forth in claim 12, further including:

removing the first filter layer from the non-sensor areas after depositing the second filter layer; and removing the second filter layer from the non-sensor areas after depositing the third filter layer.

15. The method as set forth in claim 12, wherein the first filter layer corresponds to a first subtractive primary color, the second filter layer corresponds to a second subtractive primary color and the third filter layer corresponds to a third subtractive primary color.

16. The method as set forth in claim 12, wherein the step of depositing the first layer over the substrate, exclusive of the third sensor area, further includes applying the first filter layer to at least partially planarize the device.

* * * * *